(12) United States Patent
Nahas

(10) Patent No.: US 7,280,388 B2
(45) Date of Patent: Oct. 9, 2007

(54) MRAM WITH A WRITE DRIVER AND METHOD THEREFOR

(76) Inventor: Joseph J. Nahas, 5824 Gentle Breeze Ter., Austin, TX (US) 78731

( * ) Notice: Subject to any disclaimer, the term of this patent is extended or adjusted under 35 U.S.C. 154(b) by 0 days.

(21) Appl. No.: 11/297,202

(22) Filed: Dec. 7, 2005

(65) Prior Publication Data

US 2007/0133262 A1    Jun. 14, 2007

(51) Int. Cl.
*G11C 11/00*    (2006.01)

(52) U.S. Cl. .......................... 365/158; 365/49

(58) Field of Classification Search ............... 365/158, 365/49
See application file for complete search history.

(56) References Cited

U.S. PATENT DOCUMENTS

| | | | |
|---|---|---|---|
| 5,168,395 A | 12/1992 | Klaassen et al. | |
| 6,545,906 B1 | 4/2003 | Savtchenko et al. | |
| 6,711,052 B2 | 3/2004 | Subramanian et al. | |
| 6,842,365 B1 | 1/2005 | Nahas et al. | |
| 6,859,388 B1 | 2/2005 | Nahas et al. | |
| 6,980,468 B1* | 12/2005 | Ounadjela | 365/171 |
| 7,050,325 B2* | 5/2006 | Iwata et al. | 365/158 |
| 7,123,506 B2* | 10/2006 | Shi et al. | 365/158 |
| 2002/0044481 A1 | 4/2002 | Hidaka | |
| 2002/0080646 A1 | 6/2002 | Hidaka | |

* cited by examiner

*Primary Examiner*—Amir Zarabian
*Assistant Examiner*—Anthan Tran
(74) *Attorney, Agent, or Firm*—Robert L. King; James L. Clingan, Jr.; Ranjeev Singh

(57) ABSTRACT

Each memory cell of an MRAM that uses toggle writing is written by applying to the memory cell a first field, then a combination of the first field and the second field, then the second field. The removal of the second field ultimately completes the writing of the memory cell. The combination of the first field and the second field is known to saturate a portion, the synthetic antiferromagnet (SAF), of the MRAM cell being written. This can result in not knowing which logic state is ultimately written. This is known to be worsened at higher temperatures. To avoid this deleterious saturation, the magnetic field is reduced during the time when both fields are applied. This is achieved by reducing the current that provides these fields from the current that is applied when only one of the fields is applied.

19 Claims, 10 Drawing Sheets

US 7,280,388 B2

MRAM WITH A WRITE DRIVER AND METHOD THEREFOR

CROSS REFERENCE TO RELATED APPLICATION

This application is related to a copending U.S. patent application Ser. No. 11/297,203 entitled "Memory With Write Circuitry And Method Therefor" filed of even date and assigned to the assignee of record herein.

FIELD OF THE INVENTION

This invention relates to Magnetoresistive Random Access Memories (MRAMs), and more particularly to circuits and methods for writing data in MRAMs.

BACKGROUND OF THE INVENTION

Magnetic memory devices have been proposed as a reliable and cost effective nonvolatile memory. One such device is magnetoresistive RAM (hereinafter referred to as "MRAM"). To be commercially practical, however, MRAM must have comparable memory density to current memory technologies, be scalable for future generations, operate at low voltages, have low power consumption, and have competitive read/write speeds.

For an MRAM device, the stability of the nonvolatile memory state, the repeatability of the read/write cycles, and the memory element-to-element switching field uniformity are three of the most important aspects of its design characteristics. A memory state in MRAM is not maintained by power, but rather by the direction of a magnetic moment vector. Storing data is accomplished by applying magnetic fields and causing a magnetic material in a MRAM device to be polarized into either of two possible memory states. Recalling data is accomplished by sensing the resistive differences in the MRAM device between the two states. The magnetic fields for writing are created by passing currents through strip lines external to the magnetic structure or through the magnetic structures themselves.

As the lateral dimension of an MRAM device decreases, three problems occur. First, the switching field increases for a given shape and film thickness, requiring a larger magnetic field to switch. Second, the total switching volume is reduced so that the energy barrier for reversal decreases. The energy barrier refers to the amount of energy needed to switch the magnetic moment vector from one state to the other. The energy barrier determines the data retention and the error rate of the MRAM device from unintended reversals which can occur due to thermofluctuations (superparamagnetism) if the barrier is too small. A major problem with having a small energy barrier is that it becomes extremely difficult to selectively switch one MRAM device in an array. Selectablility allows switching without inadvertently switching other MRAM devices. It is important to control the current flowing during a write operation in the array to avoid undesired current surges or spikes during transistor switching.

Finally, because the switching field is partially controlled by shape of the magnetic device, the switching field becomes more sensitive to shape variations as the MRAM device decreases in size. With photolithography scaling becoming more difficult at smaller dimensions, MRAM devices will have difficulty maintaining tight switching distributions. In any memory type, including MRAMs, there is a continuing desire to reduce the memory size and increase performance. Savtchenko et al. in U.S. Pat. No. 6,545,906 teach a toggle type MRAM with robust switching.

One important aspect of memory performance is the speed with which the memory is read and written. Speed limitations include such things as the performance of the bit cell and the capacitance of the lines running through the array. A variety of techniques have been developed to improve these characteristics. For example, memory arrays have commonly been divided into subarrays so that no single line is excessively capacitive. This can also reduce power consumption. It is important in memories to efficiently switch the write circuitry to allow the write cycle speed to approximate the read cycle speed. The inability of a FLASH to accomplish this objective is a major disadvantage of FLASH.

The promise of MRAMs is, however, that this type of memory will be a "universal" memory having both high speed and being non-volatile. Thus, the need for improvements in implementations of toggle MRAMs continues.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE PREFERRED EMBODIMENT

A known toggle MRAM is illustrated by Savtchenko et al. in U.S. Pat. No. 6,545,906 and functions to provide stored information in a memory cell by selectively positioning magnetic fields associated with current conducted by two perpendicular conductors. Each bit of an MRAM has a magnetic tunnel junction (MTJ) which is composed of a composite of conductive layers separated by a single insulator. Each of the conductive layers is magnetically polarized. The resistance of a memory bit is reduced when the magnetic polarization of the conductive layers adjacent to the insulator are polarized in a same direction. Conversely, the resistance of a memory bit is increased when the magnetic polarization of the conductive layers adjacent to the insulator are polarized in an opposite direction.

In order to enhance the applied magnetic field from current flowing through the two orthogonal conductors, each of the conductors has its outward facing surfaces lined with a ferromagnetic cladding material such as NiFe to focus the resulting magnetic field towards the MTJ between the two conductors. The cladding material enhances the effective switching magnetic field generated for a given magnitude of current in the conductors. However, the cladding material may contain some defects that cause residual magnetic fields to exist once an externally applied field has been removed. These defects are relatively uncommon in a large number of memory bits and therefore hard to detect. Also, due to the presence of several layers of magnetic materials in the MTJ, defects in any of these layers may also contribute to the existence of residual magnetic fields in an MRAM bit. Further, stray particles of magnetic materials that are present as defects generated during the fabrication process of an MTJ may also lead to the presence of residual magnetic fields after activation from externally applied fields. The residual magnetic fields may impede the proper writing of an MRAM cell as will be shown below. Compensation for the residual magnetic fields in an MRAM will be described herein.

Figure 1:
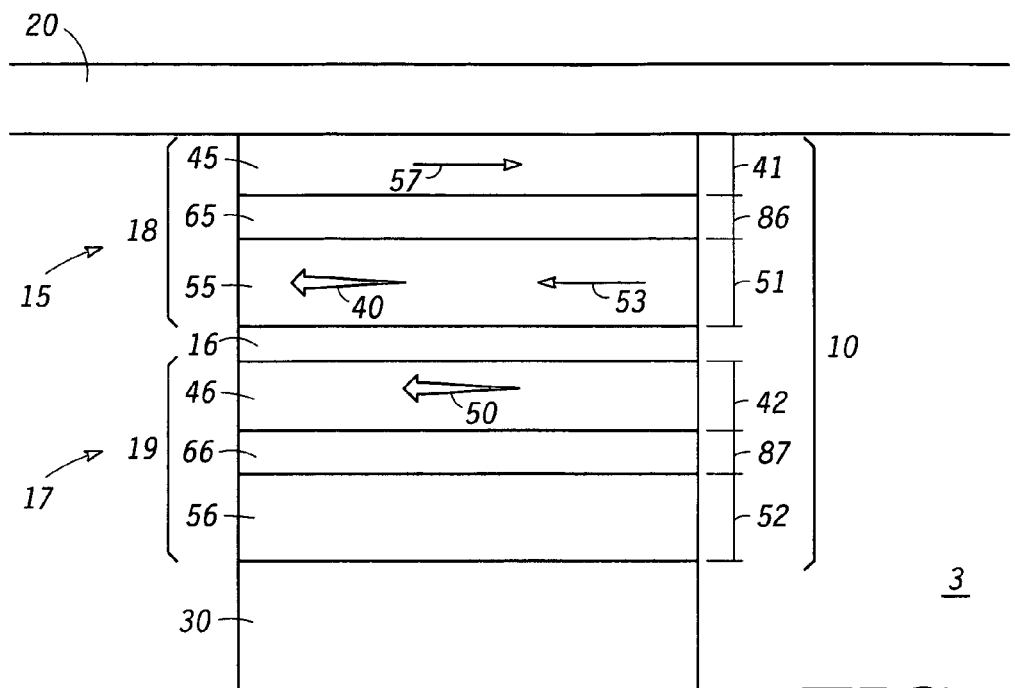
FIG. 1 illustrates a simplified sectional view of a known magnetoresistive random access memory device.

Turn now to FIG. 1, which illustrates a simplified sectional view of an MRAM array 3 in accordance with the present invention. In this illustration, only a single magnetoresistive memory device 10 is shown, but it will be understood that MRAM array 3 consists of a number of MRAM devices 10 and we are showing only one such device for simplicity in describing the writing method.

MRAM device 10 is sandwiched between a word line 20 and a bit line 30. Word line 20 and bit line 30 include conductive material such that a current can be passed therethrough. In this illustration, word line 20 is positioned on top of MRAM device 10 and bit line 30 is positioned on the bottom of MRAM device 10 and is directed at a ninety degree angle to word line 20 (See FIG. 2).

MRAM device 10 includes a first magnetic region 15, a tunneling barrier 16, and a second magnetic region 17, wherein tunneling barrier 16 is sandwiched between first magnetic region 15 and second magnetic region 17. In a preferred form, magnetic region 15 includes a tri-layer structure 18, which has an anti-ferromagnetic coupling spacer layer 65 sandwiched between two ferromagnetic layers 45 and 55. Anti-ferromagnetic coupling spacer layer 65 has a thickness 86 and ferromagnetic layers 45 and 55 have thicknesses 41 and 51, respectively. Further, magnetic region 17 has a tri-layer structure 19, which has an anti-ferromagnetic coupling spacer layer 66 sandwiched between two ferromagnetic layers 46 and 56. Anti-ferromagnetic coupling spacer layer 66 has a thickness 87 and ferromagnetic layers 46 and 56 have thicknesses 42 and 52, respectively.

Generally, anti-ferromagnetic coupling spacer layers 65 and 66 include at least one of the elements Ru, Os, Re, Cr, Rh, Cu, or combinations thereof. Further, ferromagnetic layers 45, 55, 46, and 56 include at least one of elements Ni, Fe, Mn, Co, or combinations thereof. Also, it will be understood that magnetic regions 15 and 17 can include synthetic anti-ferromagnetic layer material structures other than tri-layer structures and the use of tri-layer structures in this embodiment is for illustrative purposes only. For example, one such synthetic anti-ferromagnetic layer material structure could include a five-layer stack of a ferromagnetic layer/anti-ferromagnetic coupling spacer layer/ferromagnetic layer/anti-ferromagnetic coupling spacer layer/ferromagnetic layer structure.

Ferromagnetic layers 45 and 55 each have a magnetic moment vector 57 and 53, respectively, that are usually held anti-parallel by coupling of the anti-ferromagnetic coupling spacer layer 65. Also, magnetic region 15 has a resultant magnetic moment vector 40 and magnetic region 17 has a resultant magnetic moment vector 50. Resultant magnetic moment vectors 40 and 50 are oriented along an anisotropy easy-axis in a direction that is at an angle, preferably forty-five degrees, from word line 20 and bit line 30 (See FIG. 2). Further, magnetic region 15 is a free ferromagnetic region, meaning that resultant magnetic moment vector 40 is free to rotate in the presence of an applied magnetic field. Magnetic region 17 is a pinned ferromagnetic region, meaning that resultant magnetic moment vector 50 is not free to rotate in the presence of a moderate applied magnetic field and is used as the reference layer.

While anti-ferromagnetic coupling layers are illustrated between the two ferromagnetic layers in each tri-layer structure 18, it will be understood that the ferromagnetic layers could be anti-ferromagnetically coupled through other means, such as magnetostatic fields or other features. For example, when the aspect ratio of a cell is reduced to five or less, the ferromagnetic layers are anti-parallel coupled from magnetostatic flux closure.

In the preferred embodiment, MRAM device 10 has tri-layer structures 18 that have a length/width ratio in a range of one to five for a non-circular plan. However, we illustrate a plan that is circular (See FIG. 2). However, it will be understood that MRAM device 10 can have other shapes, such as square, elliptical, rectangular, or diamond, but is illustrated for simplicity as being circular.

Further, during fabrication of MRAM array 3, each succeeding layer (i.e. 30, 55, 65, etc.) is deposited or otherwise formed in sequence and each MRAM device 10 may be defined by selective deposition, photolithography processing, etching, etc. in any of the techniques known in the semiconductor industry. During deposition of at least the ferromagnetic layers 45 and 55, a magnetic field is provided to set a preferred easy magnetic axis for this pair (induced anisotropy). The provided magnetic field creates a preferred anisotropy axis for magnetic moment vectors 53 and 57. The preferred axis is chosen to be at a forty-five degree angle between word line 20 and bit line 30, as will be discussed presently.

Figure 2:
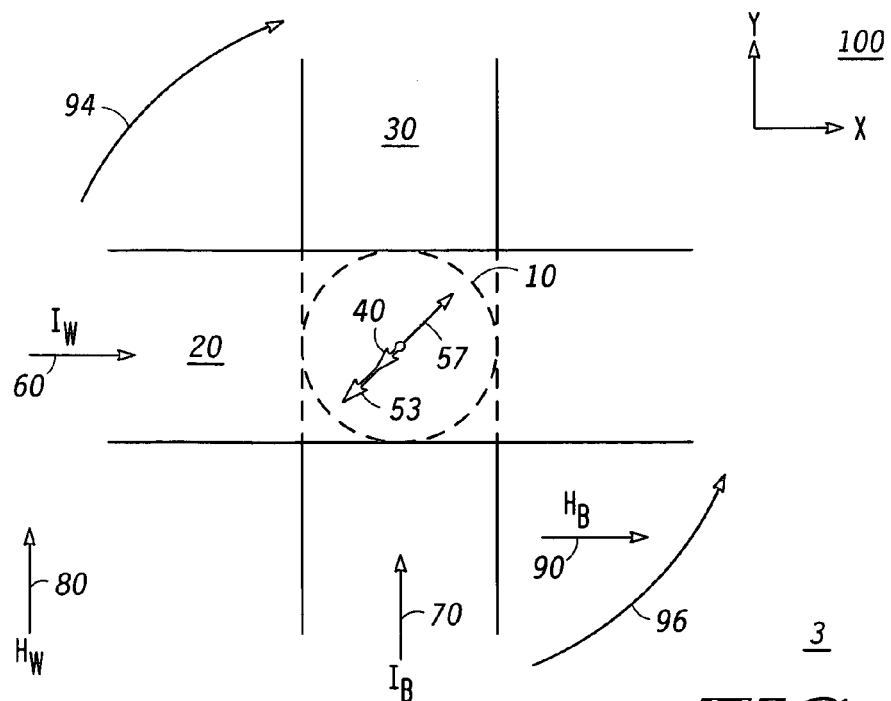
FIG. 2 illustrates a simplified plan view of a known magnetoresistive random access memory device with word and bit lines.

Turn now to FIG. 2, which illustrates a simplified plan view of a MRAM array 3 in accordance with the present invention. To simplify the description of MRAM device 10, all directions will be referenced to an x- and y-coordinate system 100 as shown and to a clockwise rotation direction 94 and a counter-clockwise rotation direction 96. To further simplify the description, it is again assumed that N is equal to two so that MRAM device 10 includes one tri-layer structure in region 15 with magnetic moment vectors 53 and 57, as well as resultant magnetic moment vector 40. Also, only the magnetic moment vectors of region 15 are illustrated since they will be switched.

To illustrate how the writing methods work, it is assumed that a preferred anisotropy axis for magnetic moment vectors 53 and 57 is directed at a forty-five degree angle relative to the negative x- and negative y-directions and at a forty-five degree angle relative to the positive x- and positive y-directions. As an example, FIG. 2 shows that magnetic moment vector 53 is directed at a forty-five degree angle relative to the negative x- and negative y-directions. Since magnetic moment vector 57 is generally oriented anti-parallel to magnetic moment vector 53, it is directed at a forty-five degree angle relative to the positive x- and positive y-directions. This initial orientation will be used to show examples of the writing methods, as will be discussed presently.

In the preferred embodiment, a word current 60 is defined as being positive if flowing in a positive x-direction and a bit line current 70 is defined as being positive if flowing in a positive y-direction. The purpose of word line 20 and bit line 30 is to create a magnetic field within MRAM device 10. A positive word current 60 will induce a circumferential word magnetic field, $H_W$ 80, and a positive bit line current 70 will induce a circumferential bit line magnetic field, $H_D$ 90. Since word line 20 is above MRAM device 10, in the plane of the element, $H_W$ 80 will be applied to MRAM device 10 in the positive y-direction for a positive word current 60. Similarly, since bit line 30 is below MRAM device 10, in the plane of the element, $H_D$ 90 will be applied to MRAM device 10 in the positive x-direction for a positive bit line current 70. It will be understood that the definitions for positive and negative current flow are arbitrary and are defined here for illustrative purposes. The effect of reversing the current flow is to change the direction of the magnetic field induced within MRAM device 10. The behavior of a current induced magnetic field is well known to those skilled in the art and will not be elaborated upon further here.

Figure 3:
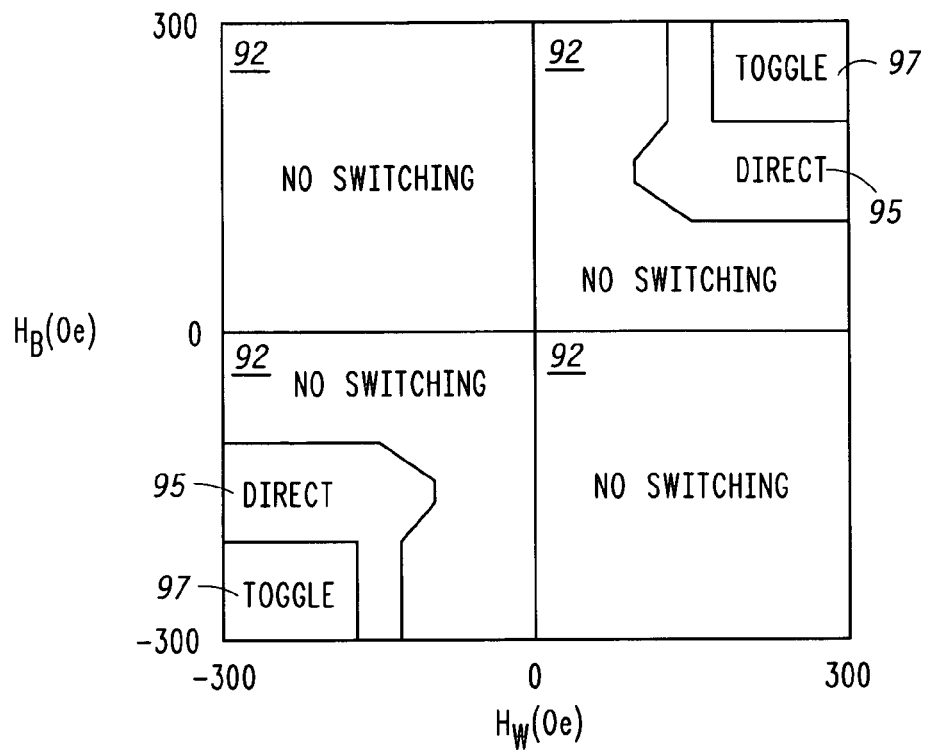
FIG. 3 illustrates in graphical form of a simulation of the magnetic field amplitude combinations that produce the direct or toggle write mode in an MRAM.
Figure 4:
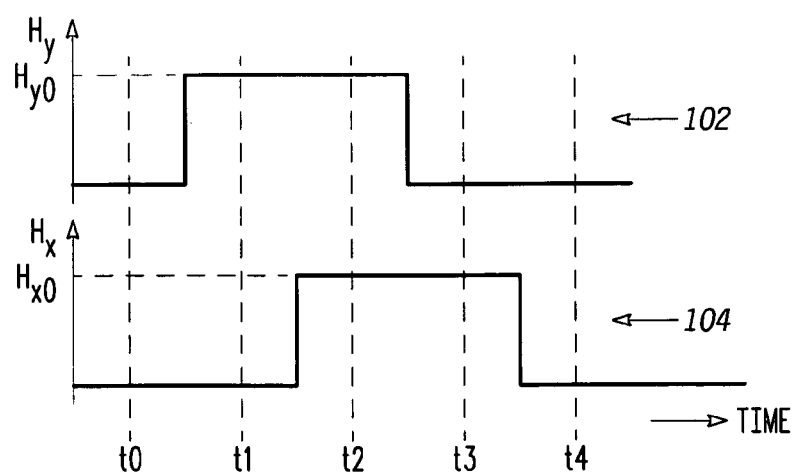
FIG. 4 illustrates in graphical form magnetic field timing for a known toggle MRAM.

Turn now to FIG. 3, which illustrates the simulated switching behavior of a SAF tri-layer structure. The simulation consists of two single domain magnetic layers that have close to the same moment (a nearly balanced SAF) with an intrinsic anisotropy, are coupled anti-ferromagnetically, and whose magnetization dynamics are described by the Landau-Lifshitz equation. The x-axis is the word line magnetic field amplitude in Oersteds, and the y-axis is the bit line magnetic field amplitude in Oersteds. The magnetic fields are applied in a pulse sequence as shown in FIG. 4 that includes magnetic field $H_y$ resulting from word current 60 and magnetic field $H_x$ resulting from bit line current 70 as functions of time.

There are three regions of operation illustrated in FIG. 3. In a region 92 there is no switching. For MRAM operation in a region 95, the direct writing method is in effect. When using the direct writing method, there is no need to determine the initial state of the MRAM device because the state is only switched if the state being written is different from the state that is stored. The selection of the written state is determined by the direction of current in both word line 20 and bit line 30. For example, if a '1' is desired to be written, then the direction of current in both lines will be positive. If a '1' is already stored in the element and a '1' is being written, then the final state of the MRAM device will continue to be a '1'. Further, if a '0' is stored and a '1' is being written with positive currents, then the final state of the MRAM device will be a '1'. Similar results are obtained when writing a '0' by using negative currents in both the word and bit lines. Hence, either state can be programmed to the desired '1' or '0' with the appropriate polarity of current pulses, regardless of its initial state. Operation in region 95 is defined as "direct write mode".

For MRAM operation in a region 97, the toggle writing method is in effect. When using the toggle writing method, there is a need to determine the initial state of the MRAM device before writing because the state is switched every time the MRAM device is written to, regardless of the direction of the currents as long as the same polarity current pulses are chosen for both word line 20 and bit line 30. For example, if a '1' is initially stored then the state of the device will be switched to a '0' after one positive current pulse sequence is flowed through the word and bit lines. Repeating the positive current pulse sequence on the stored '0' state returns it to a '1'. Thus, to be able to write the memory element into the desired state, the initial state of MRAM device 10 must first be read and compared to the state to be written. The reading and comparing may require additional logic circuitry, including a buffer for storing information and a comparator for comparing memory states. MRAM device 10 is then written to only if the stored state and the state to be written are different. One of the advantages of this method is that the power consumed is lowered because only the differing bits are switched. An additional advantage of using the toggle writing method is that only uni-polar voltages are required and, consequently, smaller N-channel transistors can be used to drive the MRAM device. Throughout this disclosure, operation in region 97 will be defined as "toggle write mode".

Both writing methods involve supplying currents in word line 20 and bit line 30 such that magnetic moment vectors 53 and 57 can be oriented in one of two preferred directions as discussed previously. To fully elucidate the two switching modes, specific examples describing the time evolution of magnetic moment vectors 53, 57, and 40 are now given.

Illustrated in FIG. 4 is a timing diagram illustrating magnetic fields in two directions X and Y and designated by 102 and 104, respectively. The timing diagram is representative of the fields used to switch an MTJ. The magnetic fields permit the toggle MRAM to be written. The magnetic fields are generated by currents in two orthogonal conductors. One of the conductors overlies the other with the MTJ in between the two conductors at the junction of the two conductors.

At time t0 the magnetic fields in both directions are zero. At time t1 the magnetic field in the Y direction is a finite value $H_{y0}$ while the magnetic field in the X direction is zero. At time t2 the magnetic field in the Y direction continues at $H_{y0}$ while the magnetic field in the X direction is at $H_{x0}$. At time t3 the magnetic field in the Y direction returns to zero while the magnetic field in the X direction continues at $H_{x0}$. At time t4 the magnetic field in both the Y direction and the X direction is at zero.

Figure 5:
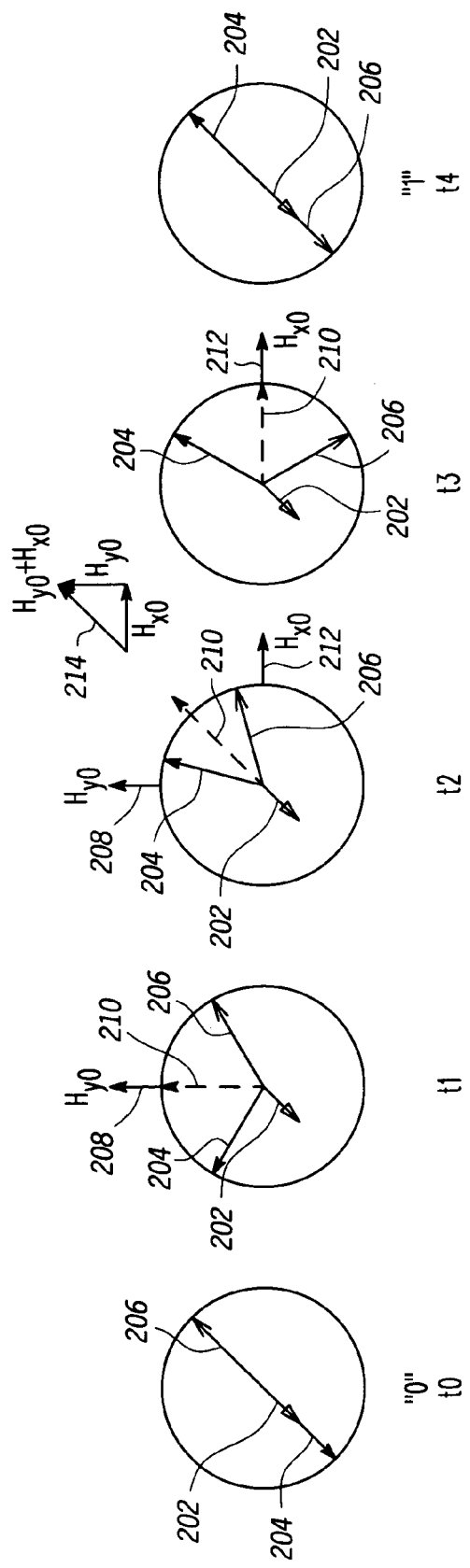
FIG. 5 illustrates in diagrammatic form the various magnetic states of the timing of FIG. 4 when writing a toggle MRAM.

Illustrated in FIG. 5 are various magnetic polarization states correlated to the timing of FIG. 4. The polarization nomenclature that is used in FIG. 5 includes the polarization of a fixed layer 202 which is below the tunnel junction of the MTJ, and the polarization of a synthetic antiferromagnet (SAF) above the tunnel junction which includes, among other layers, an upper layer 206 and a lower SAF layer 204. The lower SAF layer 204 is just above the tunnel junction of the MTJ so that the polarization of lower SAF layer 204 relative to the polarization of fixed layer 202 controls the resistance of the MTJ. When the magnetic polarizations of fixed layer 202 and lower SAF layer 204 are in the same direction, the resistance of the MTJ is in the low resistance state which is designated by the logic state "0". When the magnetic polarizations of fixed layer 202 and lower SAF layer 204 are in the opposite direction, the resistance of the MTJ is in the high resistance state which is designated by the logic state "1". At time t0 the MTJ is in the "0" logic state. In other words the lower SAF layer 204 is polarized in the same direction as fixed layer 202. The upper SAF layer 206 is polarized in the opposite direction of the lower SAF layer 204. This polarization represents a minimum energy state for the MTJ.

At time t1, magnetic field $H_{y0}$ 208 is applied to the MTJ in the Y direction. The magnetic polarization of SAF layers 204 and 206 rotate in a clockwise direction so that their net magnetic field 210 aligns with the magnetic field $H_{y0}$. At time t1, both magnetic fields $H_{y0}$ 208 and $H_{x0}$ 212 are applied to the MTJ in the Y and X direction respectively, resulting in a net magnetic field 214. The magnetic polarization of SAF layers 204 and 206 again rotate in a clockwise direction so that their net magnetic field 210 aligns with the net magnetic field 214.

At time t3, magnetic field $H_{y0}$ is removed. The magnetic polarization of SAF layers 204 and 206 further rotate in a clockwise direction so that their net magnetic field 210 aligns with the magnetic field $H_{x0}$ 212. At time t4, both magnetic fields $H_{y0}$ and $H_{x0}$ are removed. The magnetic polarization of SAF layers 204 and 206 further rotate in a clockwise direction to a new rest state. Note that lower SAF layer 204 is now polarized in a direction opposite to the magnetic fixed layer 202 representing a logic "1". The rest states that the SAF layers 204 and 206 end in are substantially opposite to the beginning magnetic states.

Figure 6:
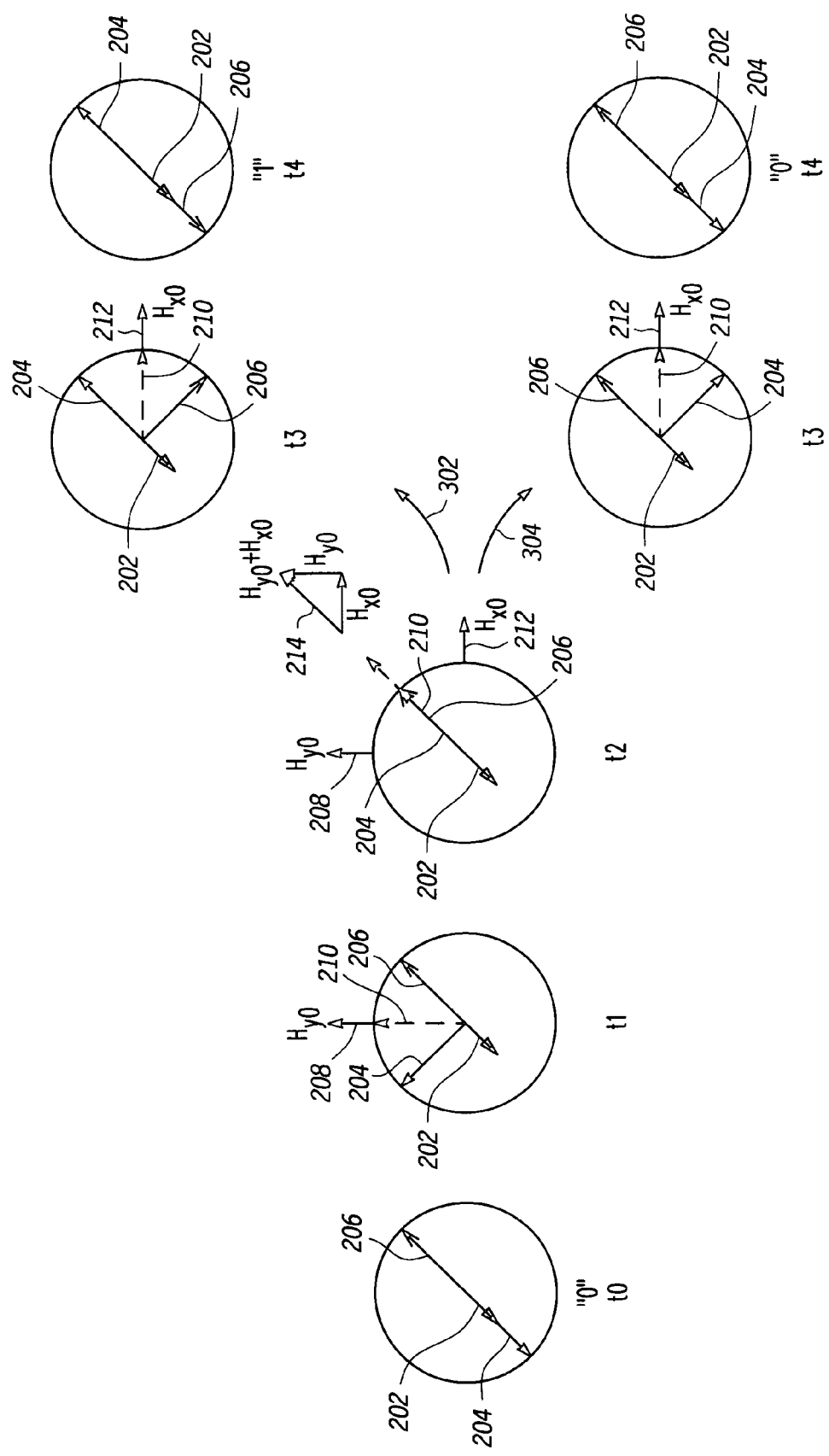
FIG. 6 illustrates in diagrammatic form the various magnetic states of a toggle MRAM write operation when magnetic saturation occurs.

Illustrated in FIG. 6 is bit toggling of a toggle MRAM when the net external magnetic field exceeds the saturation field of the SAF. A saturation field is a magnetic field threshold value above which the two magnetic layers of the SAF align with each other in a same direction. In the illustrated form, the magnetic field alignments at time t0 and t1 are the same as at that time in FIG. 5. At time t2 in FIG. 6 however a magnetic saturation state is illustrated wherein lower SAF layer 204 and upper SAF layer 206 are both aligned to the external net magnetic field 214. At time t3, when the net magnetic field falls below the saturation field, two possible magnetic states may occur and which state is likely to result is unpredictable. When the two SAF layers 204 and 206 are magnetically aligned in a same direction, it is uncertain how the two SAF layers 204 and 206 will separate from each other. For example, in example 302, at time t3 lower SAF layer 204 separates counterclockwise of upper SAF layer 206 which is the same as at time t3 in FIG. 5. In example 302, at time t4 the magnetic state is the same as at time t4 of FIG. 5.

However, in example 304 a different write result occurs. At time t3, the lower SAF layer 204 separates clockwise of upper layer SAF 206. At time t4 the magnetic state is the opposite as at time t4 of FIG. 5 which is an erroneous result.

Figure 7:
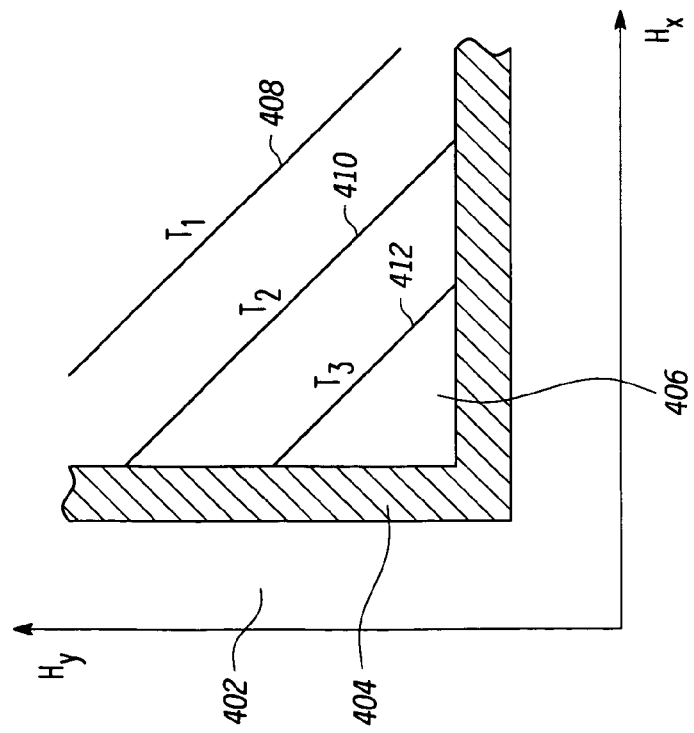
FIG. 7 illustrates in graphical form acceptable magnetic field values as a function of temperature for a toggle MRAM.

Illustrated in FIG. 7 is a graph illustrating acceptable magnetic field values which are required in a toggle MRAM for reliable switching between logic states. The vertical axis is the magnetic field in the Y direction referenced above and the horizontal axis is the magnetic field in the X direction referenced above that is orthogonal to the Y direction. Region 402 represents an area in which no toggling or switching of the MRAM occurs because at least one or both of the magnetic fields are too weak. Region 404 represents an area in which the weakest bits of a toggle MRAM will flip but the strongest bits of the toggle MRAM will not flip. Therefore region 404 is a transition region. Region 406 is a desired region representing values of the x and y direction magnetic fields in which reliable write operation occurs. The region 406 is bounded not only by the region 404 but also by a saturation region that is a cutoff. The cutoff location of the saturation region is temperature dependent. Saturation regions 408, 410 and 412 are illustrated corresponding respectively to temperature T1, T2 and T3 where T3 is greater than T2 and T2 is greater than T1. Therefore, at elevated temperatures the permissible area for the write region shrinks significantly which can result in the unreliable operation illustrated in FIG. 6.

Figure 8:
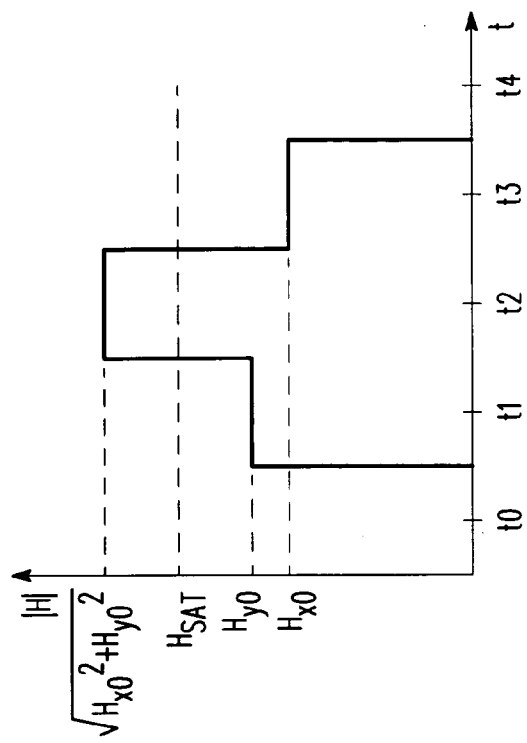
FIG. 8 illustrates in graphical form a plot of an absolute value of total magnetic field as a function of time.

FIG. 8 illustrates a graph of the absolute value of the net magnetic field for the fields and timing illustrated in FIG. 4. At time t0 the net magnetic field is zero. At time t1 the net magnetic field is $H_{y0}$. At time t2 the net magnetic field is the square root of $[(H_{y0})^2+(H_{x0})^2]$. At time t3 the net magnetic field is $H_{x0}$. At time t4 the net magnetic field is zero. If the saturation field $H_{SAT}$ is less than the peak field, the square root of $[(H_{y0})^2+(H_{x0})^2]$, then the SAF will saturate at time t2 thereby resulting in the operation illustrated in FIG. 6.

Figure 9:
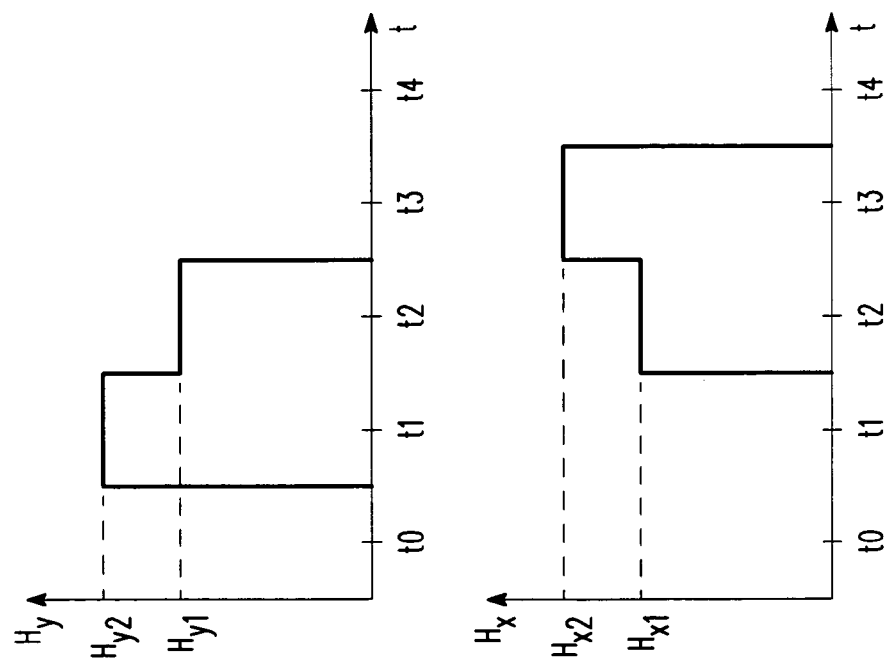
FIG. 9 illustrates in graphical form individual plots of magnetic fields in perpendicular directions as a function of time.

Illustrated in FIG. 9 are graphs illustrating desired magnetic fields in each of the X and Y direction over a period of time to avoid magnetic saturation in a toggle MRAM. At time t0 there is no magnetic field in either the X or the Y direction. At time t1 the magnetic field in the Y direction is at a value of $H_{y2}$ and the magnetic field in the X direction is zero. At time t2 the magnetic field in the Y direction is reduced from the initial maximum value during time t1 to $H_{y1}$. The magnetic field in the X direction is increased to a first value $H_{x1}$. During time t3 the magnetic field in the Y direction is zero and is elevated to $H_{y2}$ in the X direction. During time t4 the magnetic field in both the Y direction and the X direction is zero.

Figure 10:
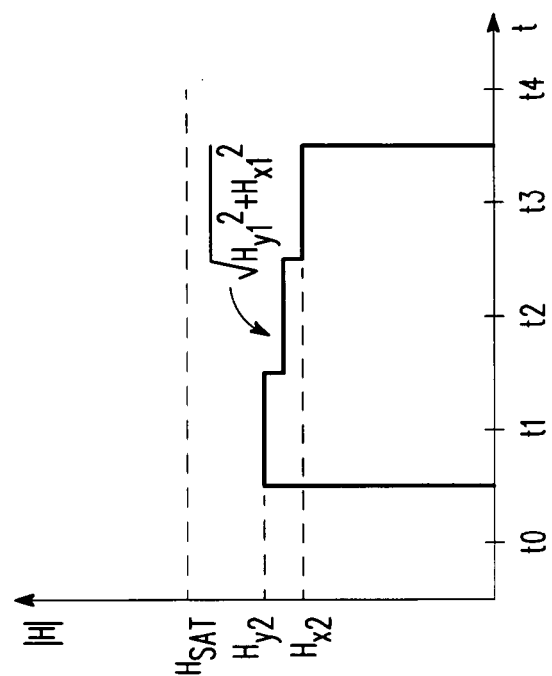
FIG. 10 illustrates in graphical form a plot of an absolute value of total magnetic field as a function of time in accordance with the present invention.

Illustrated in FIG. 10 is a graph of the absolute value of the net magnetic field applied to the MTJ corresponding to the magnetic fields of FIG. 9. During time t0 no magnetic field is applied to the MTJ. During time t1 a magnetic field having the value $H_{y2}$ is applied to the MTJ. During time t2 a magnetic field having the value of the square root of $[(H_{y1})^2+(H_{x1})^2]$ is applied to the MTJ. During time t3 a magnetic field having the value of $H_{x2}$ is applied to the MTJ. During time t4 no magnetic field is applied to the MTJ. Note that by reducing the magnetic field applied to the MTJ in both the X and the Y direction from their peak values at time t2, the absolute value of the time t2 net magnetic field is reduced and separately controlled by fields $H_{y1}$ and $H_{x1}$. Since $H_{y1}$ is less than $H_{y2}$ and $H_{x1}$ is less than $H_{x2}$, the maximum absolute value of the net magnetic field has been reduced as compared to the maximum absolute value of the net magnetic field in FIG. 8. Since the maximum absolute value of the net magnetic field controls whether or not the SAF in the bit saturates, the probability of saturation is reduced and the temperature range of operation of the MRAM bit cell is increased.

Figure 11:
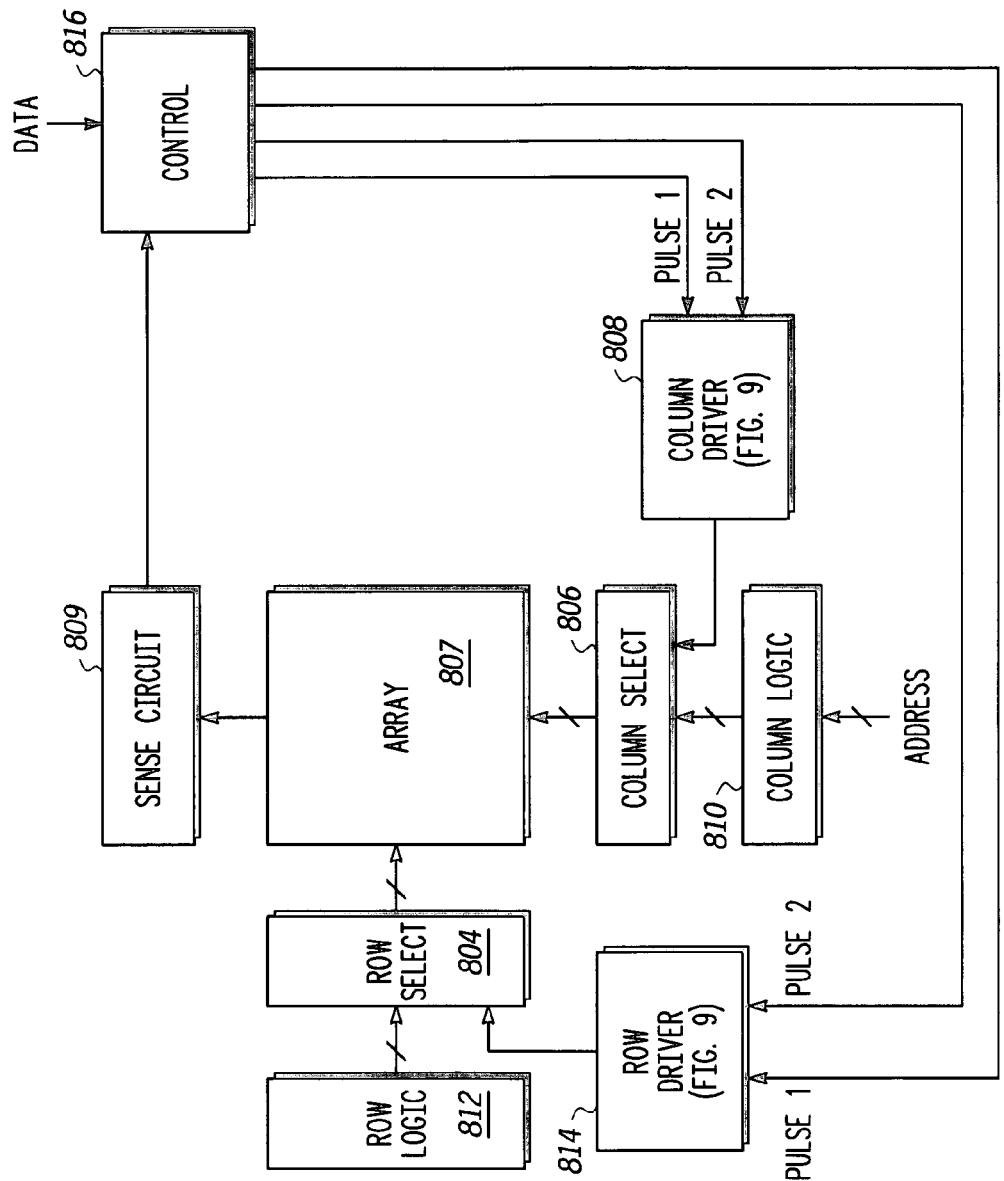
FIG. 11 illustrates in block diagram form an MRAM with a write driver in accordance with the present invention.

Illustrated in FIG. 11 is a first exemplary form of an MRAM architecture 800. It should be well understood that not all details of a memory architecture are illustrated for purposes of explaining the improvement in SAF saturation. A row select circuit 804 provides a plurality of row write currents to an array 807. Array 807 is a plurality of intersecting rows and columns of MRAM bit cells. Row logic 812 is coupled to the row select circuit 804 for providing a row selection signal to select a desired row within the array 807. A column select circuit 806 provides a plurality of column write currents to the array 807. Column logic 810 is coupled to the column select circuit 806 for providing a column selection signal to select a desired column within the array 807. An output of the array 807 is connected to an input of a sense circuit 809 for detecting the state of an addressed memory bit. An output of the sense circuit 809 is connected to an input of a control circuit 816. A data input of control circuit 816 receives data to be written into array 807. Control circuit 816 provides various outputs, only four of which are detailed in FIG. 11. In particular, two control signals labeled "PULSE 1" and "PULSE 2" are connected to first and second control inputs of a column driver 808. Two additional control signals also labeled "PULSE 1" and "PULSE 2" are connected to first and second control inputs of a row driver 814. Row driver 814 provides an output signal to the row select circuit 804 in the form of a current which is steered by row select circuit 804 to a row in array 807 as determined by the row logic 812. Similarly, the column driver 808 provides an output signal to the column select circuit 806 in the form of a current which is steered by column select circuit 806 to a column in array 807 as determined by the column logic 810. Column driver 808 and column select circuit 806 will be further detailed below in FIG. 12. It should be understood that analogous circuitry illustrated in FIG. 12 may also be used for the row driver 814 and the row select circuit 804.

Figure 12:
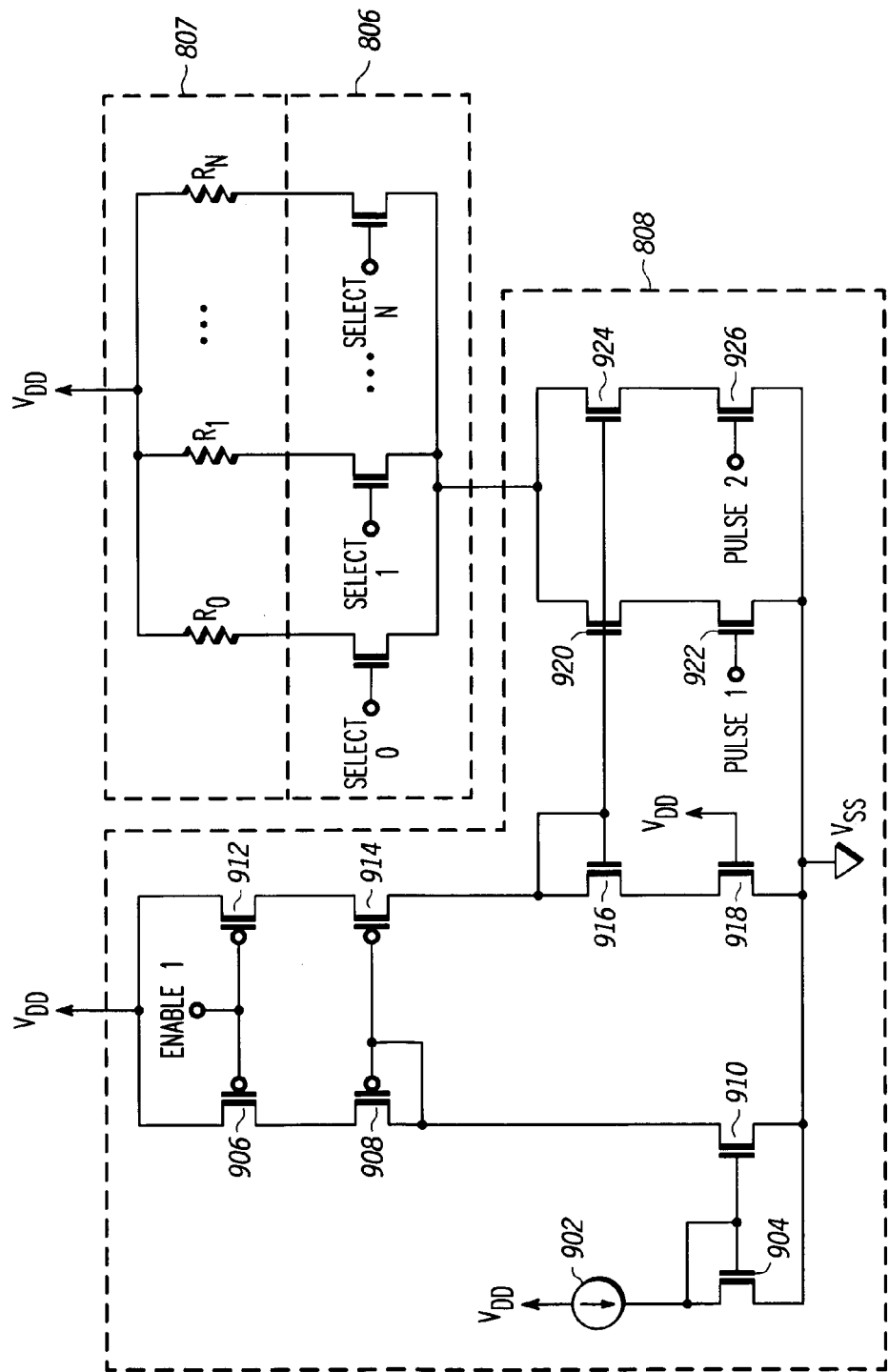
FIG. 12 illustrates in schematic form a circuit that can be used as either a column write driver or a row write driver of the MRAM of FIG. 11.

Illustrated in FIG. 12 is one form of the column driver 808. A P-channel transistor 906 has a source connected to a positive supply voltage $V_{DD}$. A P-channel transistor 912 also has a source connected to $V_{DD}$. A gate of transistor 906 is connected to a gate of transistor 912 and to an enable signal labeled ENABLE 1. A drain of transistor 906 is connected to a source of a P-channel transistor 908. A gate and a drain of transistor 908 are connected together and to a gate of a P-channel transistor 914. A source of transistor 914 is connected to a drain of transistor 912. A drain of transistor 908 is connected to a drain of an N-channel transistor 910. A source of transistor 910 is connected to a reference voltage terminal labeled $V_{SS}$. In one form the $V_{SS}$ potential is a ground reference potential but may be implemented at other voltage values less than $V_{DD}$. A current source 902 has a first terminal connected to a terminal for receiving $V_{DD}$ and a second terminal connected to both a drain and a gate of an N-channel transistor 904 that are connected together. A source of transistor 904 is connected to the $V_{SS}$ reference voltage terminal. A drain of transistor 914 is connected to a drain of an N-channel transistor 916. The drain of transistor 916 is connected to a gate thereof and to a gate of an N-channel transistor 920. A source of transistor 916 is connected to a drain of an N-channel transistor 918. A gate of transistor 918 is connected to a terminal for receiving $V_{DD}$ and a source of transistor 918 is connected to the $V_{SS}$ reference voltage terminal. A drain of transistor 920 is connected to a drain of an N-channel transistor 924 and to the column select circuit 806. A gate of transistor 924 is connected to the gate of transistor 920. A source of transistor 920 is connected to a drain of an N-channel transistor 922. A gate of transistor 922 is connected to a first control signal labeled "PULSE 1". A source of transistor 922 is connected to the Vss reference voltage terminal. A source of transistor 924 is connected to a drain of an N-channel transistor 926. A gate of transistor 926 is connected to a second control signal labeled "PULSE 2". A source of transistor 922 is connected to the $V_{SS}$ reference voltage terminal.

Column select circuit 806 has a plurality of N+1 column select transistors, where N is an integer. In the illustrated form each column select transistor is an N-channel transistor having a source connected to a source of each of the other column select transistors and to the drains of transistors 920 and 924. Each of the column select transistors has a gate coupled to one of a plurality of select signals such as "SELECT 0, SELECT 1, . . . SELECT N". Each of the column select transistors has a drain connected to a first end of a respective column of the array 807. Each of the N+1 array columns is represented by a resistance such as "$R_0$, $R_1$, . . . $R_N$". A second end of each column within array 807 is connected to $V_{DD}$.

In operation, current source 902 provides a reference current for column driver 808. Transistors 904 and 910 mirror and amplify the reference current. When column driver 808 is enabled by a low signal on ENABLE 1, then transistor 906 connects the source of transistor 908 to $V_{DD}$ and transistor 912 connects the source of transistor 914 to $V_{DD}$ making transistors 908 and 914 an active current mirror. Transistors 908 and 914 mirror and amplify the current from the drain of transistor 910.

Transistor 918 by having its gate to $V_{DD}$ is always conductive and connects the source of transistor 916 to $V_{SS}$. The current from the drain of transistor 914 biases diode-connected transistor 916 to bias the gates of transistors 920 and 924. Referring back to the $H_x$ magnetic field as a function of time in FIG. 9, during time t0 and t1, signals PULSE 1 and PULSE 2 are low so that transistors 922 and 926 are nonconductive. At time t2 PULSE 1 is high and PULSE 2 is low so that transistor 922 is conductive and transistor 926 is not conductive. Transistor 920 along with transistor 916 mirror and amplify the drain current from transistor 914. This current steered by column select circuit 806 to an addressed column of array 807 creating a magnetic field in the Y direction using the right hand rule. At time t3 PULSE 2 becomes high but PULSE 1 remains high so that both transistors 922 and 926 are conductive. Thus transistors 920 and 924 along with transistor 916 mirror and amplify the drain current in transistor 914. Thus the circuit delivers a higher current resulting in a higher magnetic field at time t3 when compared to time t2. At time t4 both the PULSE 1 and PULSE 2 signals become low so that transistors 922 and 926 are again nonconductive.

FIG. 12 also illustrates in detail one form of the column select circuit 806 and the array 807. A plurality of sources of N+1 column select transistors are each connected to the drain of transistors 920 and 924 and are controlled by a respective column select signal labeled "Select 0, Select 1 . . . Select N". The column select signals function to couple one column of the array 807 to the column driver 808. The array 807 is represented by a plurality of N+1 columns, each column having a resistance such as "R0, R1 . . . $R_N$".

Figure 13:
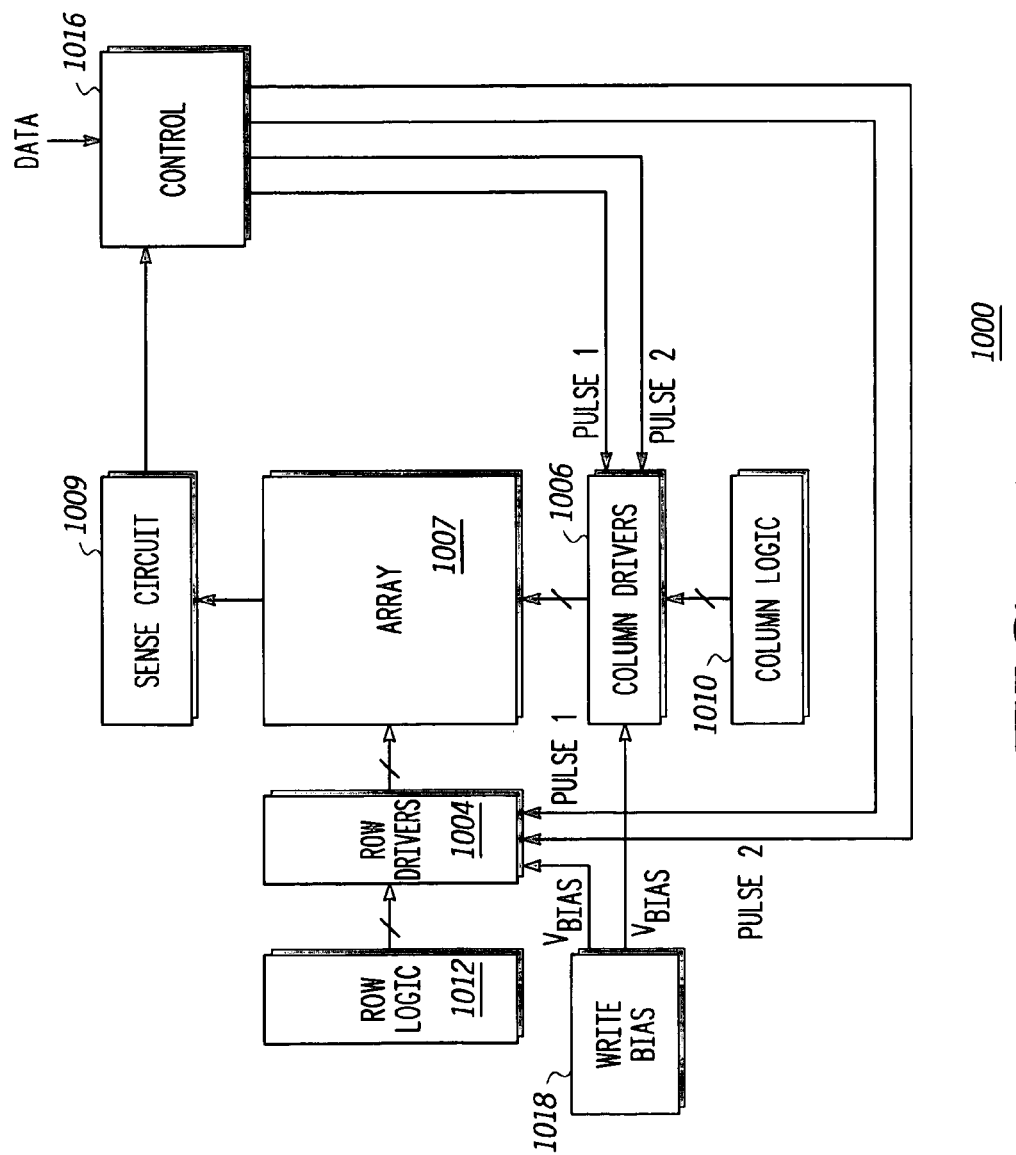
FIG. 13 illustrates in block diagram form another form of an MRAM with a driver in accordance with the present invention.

Illustrated in FIG. 13 is another exemplary form of an MRAM architecture 1000. It should be well understood that not all details of a memory architecture are illustrated for purposes of explaining the improvement in SAF saturation. A row driver circuit 1004 provides a plurality of row write currents to an array 1007. Array 1007 is a plurality of intersecting rows and columns of MRAM bit cells. Row logic 1012 is coupled to the row select circuit 1004 for providing a row selection signal to select a desired row within the array 1007. A column driver circuit 1006 provides a plurality of column write currents to an array 1007. Column logic 1010 is coupled to the column driver circuit 1006 for providing a row selection signal to select a desired column within the array 1007. An output of the array 1007 is connected to an input of a sense circuit 1009 for detecting the state of an addressed memory bit. An output of the sense circuit 1009 is connected to an input of a control circuit 1016. A data input of control circuit 1016 receives data to be written into array 1007. Control circuit 1016 provides various outputs, only four of which are detailed in FIG. 13. In particular, two control signals labeled "PULSE 1" and "PULSE 2" are connected to first and second control inputs of column drivers 1006. Two additional control signals also labeled "PULSE 1" and "PULSE 2" are connected to first and second control inputs of row drivers 1004. Column drivers 1006 will be further detailed below in FIG. 14. It should be understood that analogous circuitry illustrated in FIG. 14 may also be used for the row drivers 1004. A write bias circuit 1018 provides a bias voltage labeled $V_{BIAS}$ to each of the row drivers 1004 and to the column drivers 1006. It should be understood that the voltage value for the bias to each of row drivers 1004 and column drivers 1006 may differ in value. The write bias circuit 1018 sets a bias voltage for the row drivers 1004 and the column drivers 1006.

Figure 14:
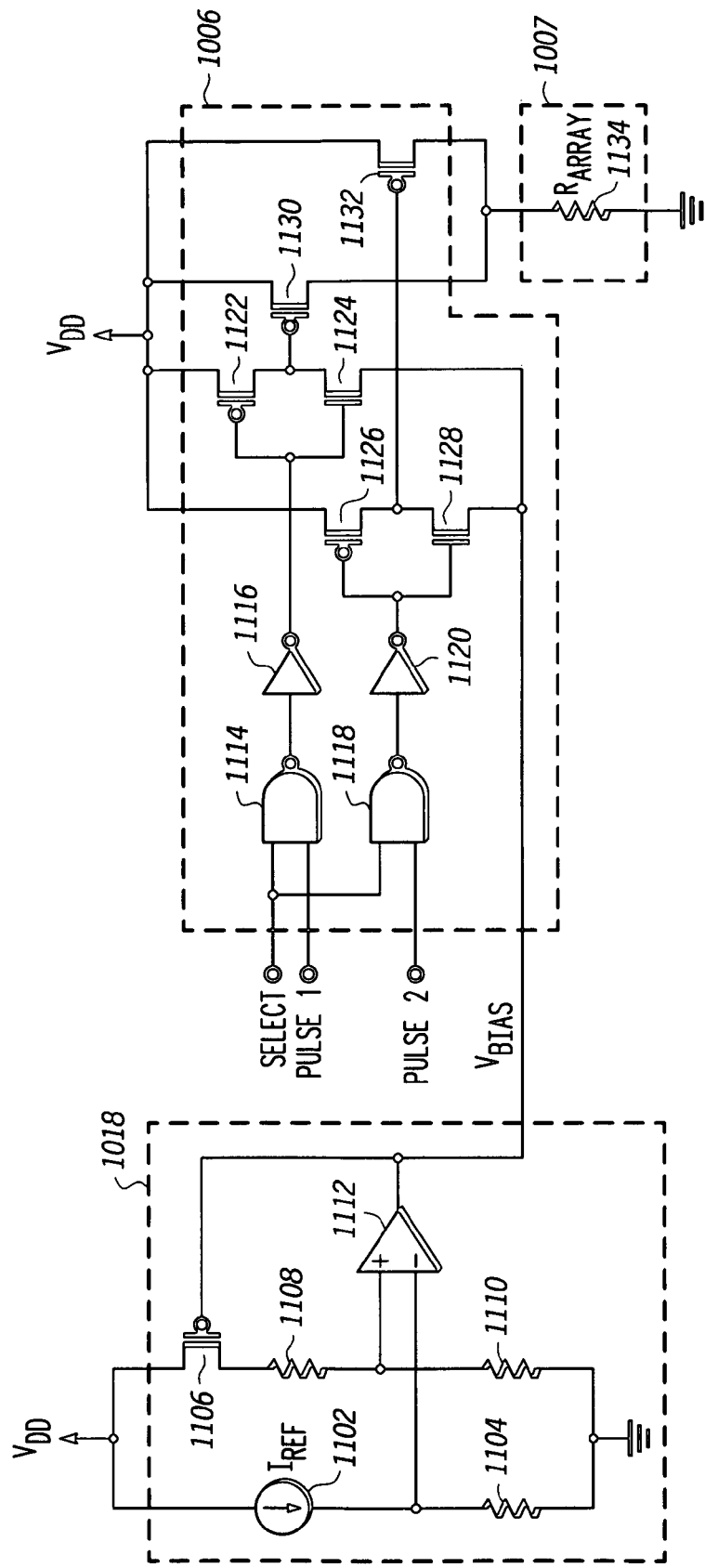
FIG. 14 illustrates in schematic diagram form a column write driver and bias circuit of the MRAM of FIG. 13.

Illustrated in FIG. 14 is an exemplary implementation of the write bias circuit 1018, the write drivers 1006 and the array 1007 of FIG. 13. In the write bias circuit 1018, a current source 1102 for providing a reference current $I_{REF}$ has a first terminal connected to supply voltage $V_{DD}$. A second terminal of current source 1102 is connected to both a first terminal of a resistor 1104 and to an inverting or negative input of an operational amplifier 1112. A second terminal of resistor 1104 is connected to a ground reference terminal. A P-channel transistor 1106 has a source connected to the supply voltage $V_{DD}$. A gate of transistor 1106 is connected to an output of operational amplifier 1112. A drain of transistor 1106 is connected to a first terminal of a resistor 1108. A second terminal of resistor 1108 is connected to a non-inverting or positive input of operational amplifier 1112 and to a first terminal of a resistor 1110. A second terminal of resistor 1110 is connected to the ground reference terminal. The output of operational amplifier 1112 provides a bias voltage labeled $V_{BIAS}$.

In the column drivers 1006, a NAND gate 1114 has a first input connected to a SELECT signal. A second input of NAND gate 1114 is connected the PULSE 1 signal of FIG. 13. A NAND gate 1118 has a first input connected to the SELECT signal. A second input of NAND gate 1118 is connected to the PULSE 2 signal of FIG. 13. An output of NAND gate 1114 is connected to an input of an inverter 1116. An output of inverter 1116 is connected to a gate of a P-channel transistor 1122 and to a gate of an N-channel transistor 1124. An output of NAND gate 1118 is connected to an input of an inverter 1120. An output of inverter 1120 is connected to a gate of a P-channel transistor 1126 and to a gate of an N-channel transistor 1128. A source of each of transistor 1122 and transistor 1126 is connected to supply voltage $V_{DD}$. A drain of transistor 1124 and transistor 1128 is connected to the bias voltage $V_{BIAS}$. A drain of transistor 1126 is connected to a drain of transistor 1128. A drain of transistor 1122 is connected to a drain of transistor 1124 and to a gate of a P-channel transistor 1130. A source of transistor 1130 is connected to $V_{DD}$ and a drain of transistor 1130 is connected to the array 1007. In particular, the drain of transistor 1130 is connected to a single column, column 1134, of the array 1007 which has multiple columns. Column 1134 is represented by a resistance that is connected to ground. A P-channel transistor 1132 has a source connected to the $V_{DD}$ supply voltage, a gate connected to the drain of transistor 1126, and a drain connected to the column 1134 of array 1007.

In operation, current source 1102 provides a reference current to resistor 1104. Resistor 1104 and resistor 1110 are size ratioed so that the resistance of resistor 1104 is a multiple of the resistance of resistor 1110. Operational amplifier 1112 is used to bias transistor 1106 so that the voltage across resistor 1110 is the same as the voltage across resistor 1104. Therefore, resistor 1110 will conduct significantly more current than resistor 1104. Resistor 1108 functions to control the drain voltage on transistor 1106. The bias voltage $V_{BIAS}$ is also used by column drivers 1006. It should be noted that only one driver of column drivers 1006 and one column of the array 1007 is illustrated in FIG. 14. Therefore, each column within array 1007 is connected to a separate driver of the column drivers 1006.

The driver of column driver 1006 functions to provide a write current to the associated column of the array 1007 in response to the SELECT signal from column logic 1010 and under control of the PULSE 1 and PULSE 2 signals. The PULSE 1 and PULSE 2 signals are timed so that the desired magnetic fields are applied to bits (not shown) in the selected column. In particular, at time t0 and t1 in FIG. 9 for $H_x$, both PULSE 1 and PULSE 2 are not asserted. At time t2, PULSE 1 is asserted which makes transistor 1124 conductive as a result of the logic action of NAND gate 1114 and inverter 1116. Transistor 1124 connects the gate of transistor 1130 to the bias voltage $V_{BIAS}$. Transistor 1130 is size ratioed proportional to transistor 1106. Thus transistor 1130 provides a known current into the connected single column 1134 of array 1107. The current in column 1134 using the right-hand rule creates field $H_{x1}$ at the selected magnetic tunnel junction in array 1107.

At time t3, both PULSE 1 and PULSE 2 are asserted to make both transistors 1124 and 1128 conductive thus connecting the gates of transistors 1130 and 1132 to voltage $V_{BIAS}$.

Transistor 1132 is also size ratioed proportional to transistor 1106. Thus transistors 1130 and 1132 provide known currents into the connected single column 1134 of array 1107. The total current in column 1134 using the right-hand rule creates field $H_{x2}$ at the selected magnetic tunnel junction in array 1107.

At time t4, both PULSE 1 and PULSE 2 are not asserted. Therefore neither transistor 1124 nor transistor 1128 is conductive and transistors 1122 and 1126 connect the gates of transistors 1130 and 1132 respectively to $V_{DD}$.

In one form there has been provided a method of writing a memory cell of an MRAM. A first magnetic field is applied to a memory cell at a first level during a first time period. A second magnetic field is applied to the memory cell at a second level during a second time period, wherein the second time period follows the first time period. The first magnetic field is applied to the memory cell at a third level during at least a portion of the second time period, wherein the third level is less than the first level. The second magnetic field is applied to the memory cell at a fourth level during a third time period, wherein the third time period is after the second time period, and the fourth level is greater than the second level. The first magnetic field is reduced to a fifth level during at least a portion of the third time period. The second magnetic field is reduced to a sixth level during a fourth time period, wherein the fourth time period is after the third time period. In one form the fifth level and sixth level are substantially zero. In a second form applying the first field and the second field are performed by passing current through conductors in the memory cell. In a third form the first level is greater than a vector sum of the second level and the third level, and the vector sum is greater than the fourth level. In a fourth form the first magnetic field is applied at the first level by passing a first current through the memory cell at a first magnitude. The second magnetic field is applied at the second level by passing a second current through the memory cell at a second magnitude. The first magnetic field is applied at the third level by passing the first current through the memory cell at a third magnitude, wherein the third magnitude is less than the first magnitude. The second magnetic field is applied at the fourth level by passing the second current through the memory cells at a fourth magnitude, wherein the fourth magnitude is greater than the second magnitude. Reducing the first magnetic field is implemented by reducing the first current to a fifth magnitude. Reducing the second magnetic field is implemented by reducing the second current to a sixth magnitude. The fifth magnitude and the sixth magnitude are substantially zero. In one form, the fifth magnitude and the sixth magnitude are substantially zero.

In a second form there is provided a method of writing a memory cell of an MRAM, wherein the memory cell has a synthetic antiferromagnet (SAF) layer that can be saturated by a magnetic field of sufficient magnitude applied to the memory cell. A first magnetic field and a second magnetic field are applied to the memory cell at different times. The first magnetic field and the second magnetic field are applied to the memory cell during an overlap time wherein a vector sum of the first magnetic field and second magnetic field during the overlap time is lower than the sufficient magnitude. In one form the applying of the magnetic fields is performed by passing current through conductors in the memory cell. In a second form the first magnetic field and the second magnetic field are applied to the memory cell at different times by applying the first magnetic field at a first level prior to the overlap time and applying the second magnetic field at a second level after the overlap time. In one form the first level exceeds the vector sum, and the vector sum exceeds the second level.

In a third form there is provided an MRAM having an MRAM array having a plurality of MRAM cells. A write driver is provided for writing a memory cell of the plurality of MRAM cells. The write driver includes a first driver coupled to the memory cell for passing a first portion of a first current through a first current path of the memory cell and a second driver coupled to the memory cell that passes a second portion of the first current through the first current path. A third driver is coupled to the memory cell for passing a first portion of a second current through a second current path. A fourth driver is coupled to the memory cell for passing a second portion of the second current through the second current path. A select circuit enables the first driver and the second driver during a first time period, the first driver during a second time period, the third driver and the fourth driver during a third time period, and the third driver during the second time period. In one form the first driver includes a first plurality of transistors connected in parallel, and the second driver includes a second plurality of transistors connected in parallel with the first plurality of transistors. In one form the third driver includes a third plurality of transistors connected in parallel, and the fourth driver includes a fourth plurality of transistors connected in parallel with the third plurality of transistors. In a second form the select circuit includes a first select circuit coupled to the first driver and the second driver. A second select circuit is coupled to the third driver and the fourth driver. In one form the first select circuit includes a bias circuit, a logic circuit, and an output stage coupled to the bias circuit, the logic circuit, the first driver, and the second driver. In one form the logic circuit includes a first logic gate having a first input for receiving a first pulse, a second input for receiving an enable signal, and an output coupled to the output stage. A second logic gate has a first input for receiving a second pulse, a second input for receiving the enable signal, and an output coupled to the output stage. In a second form the output stage includes a first pair of transistors connected in series and coupled to the logic circuit and the first driver. A second pair of transistors is connected in series coupled to the logic circuit and the second driver. In a second form the first select circuit includes a current mirror coupled to the first driver and the second driver and sets a bias for the first driver and the second driver. In one form the first select circuit couples a first pulse to the first driver and a second pulse to the second driver. In one form the current is enabled by an enable signal.

By now it should be apparent that there has been provided an MRAM having an improved mechanism for avoiding magnetic field saturation of the SAF layers of tunnel junctions. Various changes and modifications to the embodiments herein chosen for purposes of illustration will readily occur to those skilled in the art. For example, although a toggle programming MRAM is discussed for some applications, it should be apparent that other types of memory cells may utilize the features disclosed herein. Variations in the types of conductivities of transistors, the types of transistors, etc. may be readily made. Although specific logic circuits have been shown, numerous logic circuit implementations may be used to implement the functions discussed herein. To the extent that such modifications and variations do not depart from the spirit of the invention, they are intended to be included within the scope thereof which is assessed only by a fair interpretation of the following claims.

The invention claimed is:

1. A method of writing a memory cell of an MRAM comprising an anti-ferromagnetic layer, the method comprising:

applying a first magnetic field to a memory cell at a first level during a first time period;

applying a second magnetic field to the memory cell at a second level during a second time period, wherein the second time period follows the first time period;

applying the first magnetic field to the memory cell at a third level during at least a portion of the second time period, wherein the third level is less than the first level, wherein the second level and the third level are selected in a manner such that a vector sum of the first magnetic field and the second magnetic field does not exceed a saturation level of the anti-ferromagnetic layer during the second time period;

applying the second magnetic field to the memory cell at a fourth level during a third time period, wherein the third time period is after the second time period, and the fourth level is greater than the second level;

reducing the first magnetic field to a fifth level during at least a portion of the third time period; and reducing the second magnetic field to a sixth level during a fourth time period, wherein the fourth time period is after the third time period.

2. The method of claim 1, wherein the fifth level and the sixth level are substantially zero.

3. The method of claim 1, wherein the steps of applying the first magnetic field and the second magnetic field are performed by passing current through conductors in the memory cell.

4. The method of claim 1, wherein the first level is greater than the vector sum of the second level and the third level, and the vector sum is greater than the fourth level.

5. The method of claim 1, wherein:
the applying the first magnetic field at the first level comprises passing a first current through the memory cell at a first magnitude;
the applying the second magnetic field at the second level comprises passing a second current through the memory cell at a second magnitude;
the applying the first magnetic field at the third level comprises passing the first current through the memory cell at a third magnitude, wherein the third magnitude is less than the first magnitude;
the applying the second magnetic field at the fourth level comprises passing the second current through the memory cell at a fourth magnitude, wherein the fourth magnitude is greater than the second magnitude;
the reducing the first magnetic field comprises reducing the first current to a fifth magnitude; and
the reducing the second magnetic field comprises reducing the second current to a sixth magnitude.

6. The method of claim 5, wherein the fifth magnitude and the sixth magnitude are substantially zero.

7. The method of claim 1, wherein the anti-ferromagnetic layer is a synthetic antiferromagnet layer.

8. A method of writing a memory cell of an MRAM comprising an anti-ferromagnetic layer, the method comprising:
applying a first magnetic field to a memory cell at a first level during a first time period;
applying a second magnetic field to the memory cell at a second level during a second time period, wherein the second time period follows the first time period;
applying the first magnetic field to the memory cell at a third level during at least a portion of the second time period, wherein the third level is less than the first level, wherein the second level and the third level are selected in a manner such that a vector sum of the first magnetic field and the second magnetic field does not exceed a saturation level of the anti-ferromagnetic layer during the second time period;
applying the second magnetic field to the memory cell at a fourth level during a third time period, wherein the third time period is after the second time period, and the fourth level is greater than the second level;
reducing the first magnetic field to a fifth level during at least a portion of the third time period; and
reducing the second magnetic field to a sixth level during a fourth time period, wherein the fourth time period is after the third time period, wherein the fifth level and the sixth level are substantially zero.

9. The method of claim 8, wherein the steps of applying the first magnetic field and the second magnetic field are performed by passing current through conductors in the memory cell.

10. The method of claim 8, wherein the first level is greater than the vector sum of the second level and the third level, and the vector sum is greater than the fourth level.

11. The method of claim 8, wherein:
the applying the first magnetic field at the first level comprises passing a first current through the memory cell at a first magnitude;
the applying the second magnetic field at the second level comprises passing a second current through the memory cell at a second magnitude;
the applying the first magnetic field at the third level comprises passing the first current through the memory cell at a third magnitude, wherein the third magnitude is less than the first magnitude;
the applying the second magnetic field at the fourth level comprises passing the second current through the memory cell at a fourth magnitude, wherein the fourth magnitude is greater than the second magnitude;
the reducing the first magnetic field comprises reducing the first current to a fifth magnitude; and
the reducing the second magnetic field comprises reducing the second current to a sixth magnitude.

12. The method of claim 11, wherein the fifth magnitude and the sixth magnitude are substantially zero.

13. The method of claim 8, wherein the anti-ferromagnetic layer is a synthetic antiferromagnet layer.

14. A method of writing a memory cell of an MRAM comprising an anti-ferromagnetic layer, the method comprising:
applying a first magnetic field to a memory cell at a first level during a first time period;
applying a second magnetic field to the memory cell at a second level during a second time period, wherein the second time period follows the first time period;
applying the first magnetic field to the memory cell at a third level during at least a portion of the second time period, wherein the third level is less than the first level, wherein the second level and the third level are selected in a manner such that a vector sum of the first magnetic field and the second magnetic field does not exceed a saturation level of the anti-ferromagnetic layer during the second time period;
applying the second magnetic field to the memory cell at a fourth level during a third time period, wherein the third time period is after the second time period, and the fourth level is greater than the second level, wherein the first level is greater than the vector sum of the second level and the third level, and the vector sum is greater than the fourth level;
reducing the first magnetic field to a fifth level during at least a portion of the third time period; and
reducing the second magnetic field to a sixth level during a fourth time period, wherein the fourth time period is after the third time period.

15. The method of claim 14, wherein the fifth level and the sixth level are substantially zero.

16. The method of claim 14, wherein the steps of applying the first magnetic field and the second magnetic field are performed by passing current through conductors in the memory cell.

17. The method of claim 14, wherein:
the applying the first magnetic field at the first level comprises passing a first current through the memory cell at a first magnitude;
the applying the second magnetic field at the second level comprises passing a second current through the memory cell at a second magnitude;
the applying the first magnetic field at the third level comprises passing the first current through the memory cell at a third magnitude, wherein the third magnitude is less than the first magnitude;
the applying the second magnetic field at the fourth level comprises passing the second current through the memory cell at a fourth magnitude, wherein the fourth magnitude is greater than the second magnitude;
the reducing the first magnetic field comprises reducing the first current to a fifth magnitude; and
the reducing the second magnetic field comprises reducing the second current to a sixth magnitude.

18. The method of claim 17, wherein the fifth magnitude and the sixth magnitude are substantially zero.

19. The method of claim 14, wherein the anti-ferromagnetic layer is a synthetic antiferromagnet layer.

* * * * *